(12) United States Patent
Zumkehr et al.

(10) Patent No.: US 7,729,168 B2
(45) Date of Patent: Jun. 1, 2010

(54) REDUCED SIGNAL LEVEL SUPPORT FOR MEMORY DEVICES

(75) Inventors: John F. Zumkehr, Orange, CA (US); James E. Chandler, Mission Viejo, CA (US); Jeffrey E. Smith, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 11/769,870

(22) Filed: Jun. 28, 2007

(65) Prior Publication Data
US 2009/0003112 A1    Jan. 1, 2009

(51) Int. Cl.
*G11C 16/06* (2006.01)
(52) U.S. Cl. .............................. 365/185.09; 365/189.07
(58) Field of Classification Search ............ 365/185.09, 365/189.07
See application file for complete search history.

(56) References Cited

U.S. PATENT DOCUMENTS

| | | | |
|---|---|---|---|
| 5,132,555 A | 7/1992 | Takahashi | |
| 7,057,397 B1 | 6/2006 | Davidson et al. | |
| 7,071,728 B2 | 7/2006 | Chandler et al. | |
| 7,095,245 B2 | 8/2006 | Zumkehr et al. | |
| 2003/0043641 A1 | 3/2003 | Mazumder et al. | |
| 2004/0268161 A1 | 12/2004 | Ross | |
| 2005/0262323 A1 | 11/2005 | Woo | |
| 2006/0083079 A1 | 4/2006 | Hwang et al. | |
| 2006/0126405 A1* | 6/2006 | Jung | 365/189.07 |
| 2008/0175054 A1* | 7/2008 | Hancock et al. | 365/185.09 |

OTHER PUBLICATIONS

"First Office Action", European Application No. 08250932.4, Mailed Feb. 13, 2009, 1 page.
"Search Report", European Application No. 08250932.4, Search Report Issued Oct. 20, 2008, 6 pages.

* cited by examiner

*Primary Examiner*—Hoai V Ho
*Assistant Examiner*—Jason Lappas
(74) *Attorney, Agent, or Firm*—Blakely, Sokoloff, Taylor & Zafman LLP

(57) ABSTRACT

Embodiments of the invention are generally directed to systems, methods, and apparatuses for reduced signal level support for memory devices. In some embodiments, a host includes one or more additional electrical contacts to provide a controllable voltage reference to a memory device. The host may also include driver circuitry to provide a driver signal to the memory device. In some embodiments, the driver signal is substantially symmetrical around the controllable voltage reference.

23 Claims, 5 Drawing Sheets

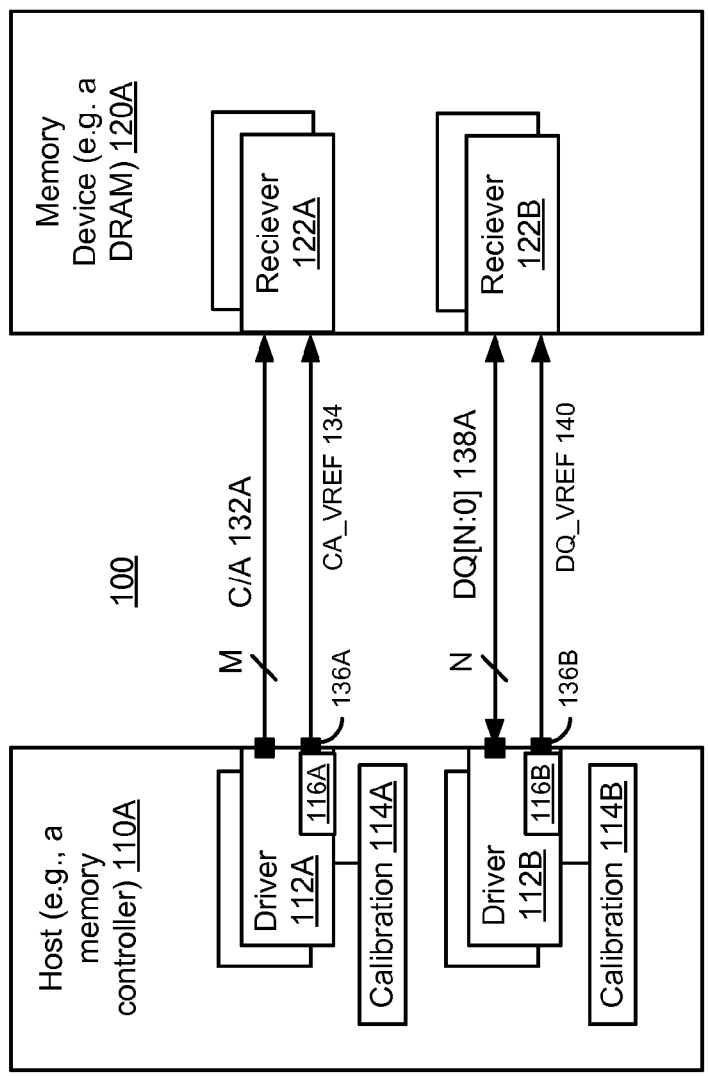
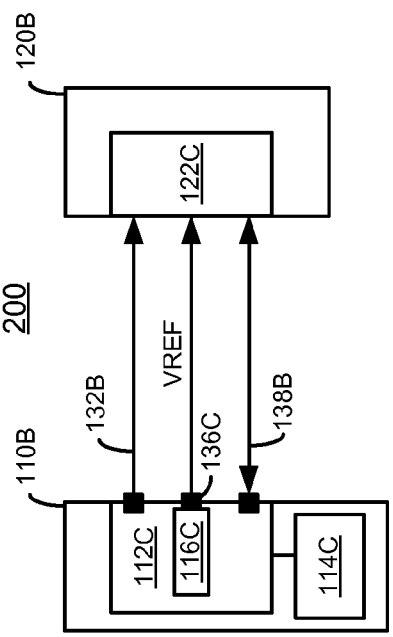
FIG. 1
FIG. 2

REDUCED SIGNAL LEVEL SUPPORT FOR MEMORY DEVICES

TECHNICAL FIELD

Embodiments of the invention generally relate to the field of integrated circuits and, more particularly, to systems, methods and apparatuses for reduced signal level support for memory devices.

BACKGROUND

Relatively high speed interfaces, such as double data rate (e.g., DDR, DDR2, and DDR3, etc.) interfaces may include receivers that use a voltage reference (VREF). An incoming digital signal is compared with the VREF to determine whether or not the input signal is a logic level zero or a logic level one. The voltage level of the VREF acts as a trip point (or switch point). An input signal with a voltage level above the trip point is a logic level one and an input signal with a voltage level below the trip point is a logic level zero.

The regulators that provide the VREF also typically provide the memory device (e.g., a dynamic random access memory device or DRAM) voltage. The VREF is usually fixed at one-half of the DRAM voltage. This arrangement is premised on the DRAM and host having processes that use similar operating voltages. For example, if both the DRAM and the host are based on processes that use an operating voltage of 1.5 V, than the driver signal is likely to be centered (more or less) on a VREF of 750 mV.

In some cases, however, the host that provides the input signal may be based on a process that uses a lower operating voltage than the DRAM. For example, a DRAM may use a standard DRAM voltage (e.g., 1.5 V) but the host may be based on a low-power process that uses a lower operating voltage (e.g., 1.1 V). In such cases, the signal level on the host-side of the interface may not be supported by the receivers on the DRAM side of the interface.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1 is a high-level block diagram illustrating selected aspects of a computing system implemented according to an embodiment of the invention.

FIG. 2 is a high-level block diagram illustrating selected aspects of a computing system having a shared VREF electrical contact, according to an embodiment of the invention.

DETAILED DESCRIPTION

Figure 3:
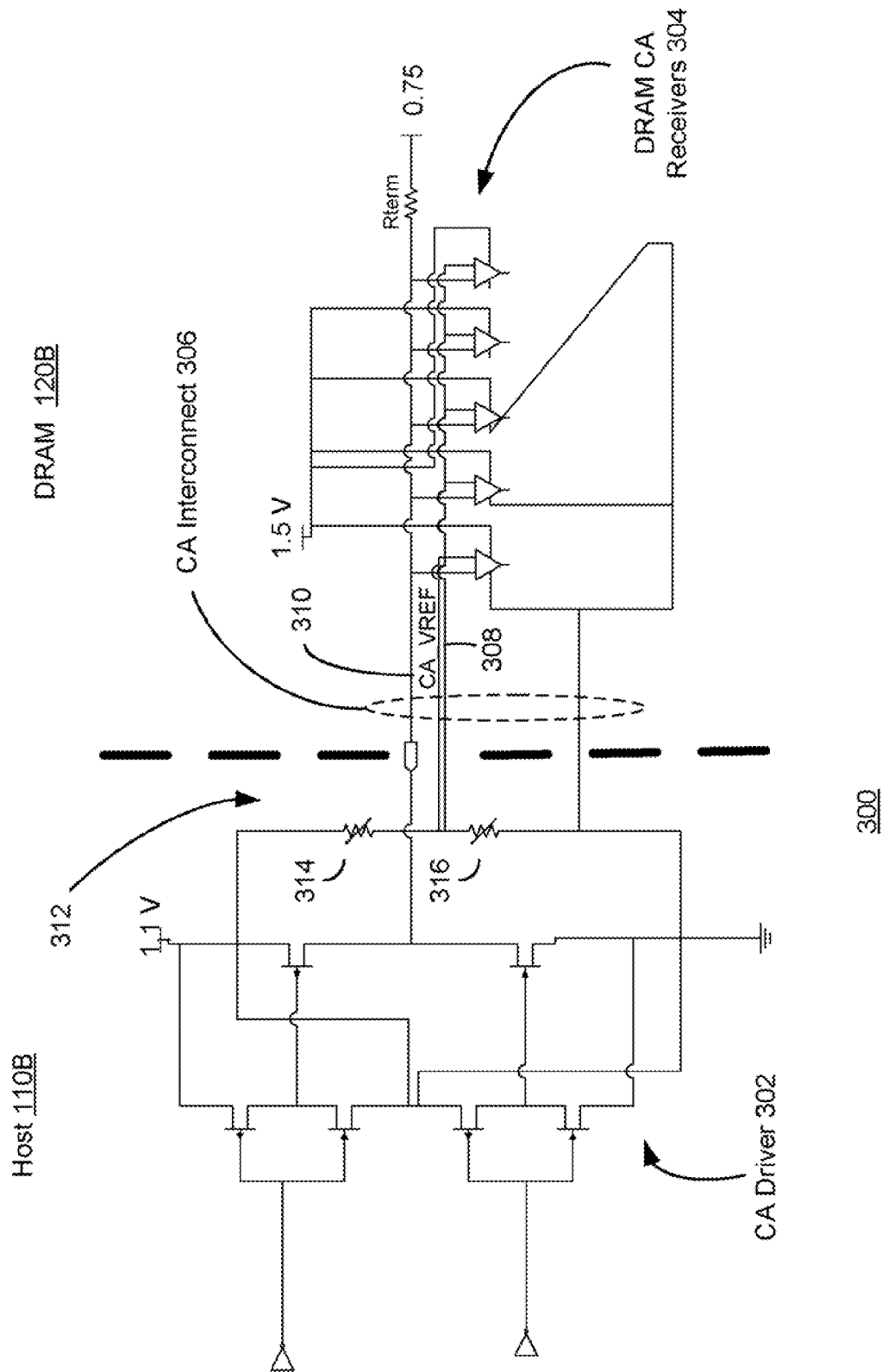
FIG. 3 is a circuit diagram illustrating selected aspects of a command/address input/output (I/O) signal architecture, according to an embodiment of the invention.

Embodiments of the invention are generally directed to systems, methods, and apparatuses to enable reduced signal level support for memory devices. In some embodiments, a host (e.g., a memory controller, processor, etc.) includes at least one additional electrical contact (e.g., pin, pad, etc.) to provide a controllable VREF to a memory device (or devices). The VREF is varied to optimize signal capture at the memory device. A host-side driver circuit may provide a driver signal that is substantially symmetrical around the VREF. In some embodiments, the use of a controllable VREF and an associated controllable driver signal support the operation of DDR (e.g., DDR3) interfaces at signal levels that are reduced from those used in conventional systems. The support for reduced signal levels enables the interface to be used with hosts that are based on processes that use less voltage than that used by the memory device.

FIG. 1 is a high-level block diagram illustrating selected aspects of a computing system implemented according to an embodiment of the invention. In the illustrated embodiment, system 100 includes host 110 (e.g., a memory controller) and memory device 120 (e.g., a DRAM). In alternative embodiments, system 100 may include more elements, fewer elements, and/or different elements.

Host 110 controls the transfer of data to and from memory device 120. In some embodiments, host 110 is part of the chipset of a computing system (e.g., part of the Northbridge). In alternative embodiments, host 110 is integrated onto the same die as one or more processors. Host 110 includes drivers 112 and calibration circuits 114. Drivers 112A are coupled with command/address (CA) interconnect 132 and drivers 112B are coupled with DQ interconnect 138. It is to be appreciated that host 110 may include nearly any number of drivers of 112.

In some embodiments, at least some of the drivers 112 include voltage reference (VREF) generation circuitry 116. VREF generation circuitry 116 provides a controllable VREF to memory device 120. Memory device 120 uses the VREF as a reference for the driver signals of one or more associated drivers 112. For example, receiver 122A may use a VREF provided by VREF generation circuitry 116A as a reference for driver signals from driver (or drivers) 112A.

In some embodiments, host 110 includes additional electrical contact(s) 136. Electrical contact(s) 136 provide a contact to couple a VREF to an appropriate interconnect. The term "electrical contact" broadly refers to an externally available contact of an integrated circuit suitable for conveying an electrical signal to an interconnect (e.g., a pin, a pad, a ball, and the like). Electrical contact(s) 136 are referred to as "additional" electrical contacts because conventional hosts do not include an electrical contact to supply VREF to a memory device.

In some embodiments, host 110 may include two or more electrical contacts 136 to supply two or more VREFs to memory device 120. The settings for the VREFs may be independent from one another to support different optimization points for different VREFs. System 100, for example, includes electrical contacts 136A and 136B. Contact 136A couples CA_VREF 134 over command/address interconnect 132A. Similarly, contact 136B couples DQ_VREF 140 over DQ interconnect 138A.

In alternative embodiments, host 110 may include a single electrical contact 136 to supply a VREF to memory device 120. Referring to system 200 shown in FIG. 2, for example, electrical contact 136C provides a VREF for CA interconnect 132B and DQ interconnect 138B. In yet other alternative embodiments, host 110 may use more than two electrical contacts 136.

In some embodiments, driver 112 symmetrically drives a signal around an associated VREF. For example, driver 112A symmetrically drives a signal around CA_VREF 134. Similarly, driver 112B symmetrically drives a signal around DQ_VREF 140. As is further discussed below with reference to FIG. 5, a calibration process may be used to calibrate drivers 112 so that the driver signals are symmetrical around a VREF. The calibration process may use calibration circuits 114 to calibrate drivers 112. Calibration circuits 114 may set the pull up and pull down values of driver 112 to determine the characteristics of the driver signal.

In conventional systems the pull up and pull down values are substantially equal. Unlike conventional systems, however, calibration circuit 114 may set the pull up values to be stronger than the pull down values. The reason for this is that, in some embodiments, host 110 is based on a process that uses a lower voltage that memory device 120. In such embodiments, VREF may be set so that it is somewhat less than one half of the DRAM operating voltage and somewhat more than one half of the host operating voltage. An example of this is further discussed below with reference to FIGS. 3 and 4.

Memory device 120 provides, at least in part, the system main memory for system 100. In some embodiments, memory device 120 is a DDR DRAM (e.g., a DDR3 DRAM). Memory device 120 includes, inter alia, receivers 122 to receive signals from host 110. Memory device 120 may be one of a number of memory devices on a memory module. Alternatively, memory device 120 may be attached to a main system circuit board (not shown) for computing system 100.

Command/Address (CA) lanes 132 provide a plurality of lanes for sending commands and addresses to memory device 120. DQ lanes 138 provide a bi-directional read/write data interconnect (or data bus). In alternative embodiments, DQ lanes 138 may be unidirectional. For ease of description, system 100 is illustrated as having M C/A lanes and N DQ lanes. It is to be appreciated that the values M and N depend on the implementation details of a particular computing system.

FIG. 3 is a circuit diagram illustrating selected aspects of a command/address (CA) input/output (I/O) signal architecture, according to an embodiment of the invention. System 300 includes CA driver 302 and DRAM CA receivers 304 coupled together via CA interconnect 306. For ease of description, only a single driver 302 is shown. In addition, only a portion of CA interconnect 306 is shown. It is to be appreciated that a host (e.g., host 110) may have nearly any number of CA drivers 302. In addition, CA interconnect 306 may include nearly any number of bit lanes, signal lines, electrical contacts, and the like. In alternative embodiments, system 300 may include more elements, fewer elements, and/or different elements.

In conventional systems, a VREF for the DRAM receivers is typically provided by the same regulator that provides the receiver operating voltage and is typically set to one-half of the receiver operating voltage (or 750 mV in the illustrated example). In other conventional systems, a resistor-divider network (e.g., on the memory module) may provide the receiver operating voltage. In conventional systems, the CA driver typically operates at substantially the same operating voltage as the DRAM receivers. The driver signal, in conventional systems, is typically centered on one-half of its operating voltage which is substantially equal to one-half the receiver operating voltage.

Unlike conventional systems, in some embodiments, the operating voltage for driver 302 is less than the operating voltage for receivers 304. For example, in the illustrated embodiment, the operating voltage for driver 302 is 1.1 V and the operating voltage for receivers 304 is 1.5 V. In some embodiments, system 300 includes a mechanism to adapt the interface for CA interconnect 306 to support the lower operating voltage used by driver 302.

In particular, host 110B provides a controllable CA_VREF 308. CA_VREF 308 may be set to a percentage of the operating voltage for CA driver 302 (e.g., a percentage of 1.1 V). In some embodiments, CA_VREF 308 is set to a value that is close to the normal operating point for DRAM 120B and yet still provides adequate voltage margins for driver signal 310. For example, CA_VREF 308 may be set to a value that is more than one half of the operating voltage of driver 302 and less than one half of the operating voltage of receivers 304. In the illustrated embodiment, for example, CA_VREF 308 may be set to (approximately) 600 mV.

Host 110B includes VREF generation circuitry 312 to generate CA_VREF 308. In the illustrated embodiment, VREF generation circuitry 312 includes a voltage divider network (e.g., variable resistors 314 and 316). In alternative embodiments, VREF generation circuitry 312 may be implemented differently.

In some embodiments, the values of variable resistors 314 and 316 may be set during a calibration process by, for example, circuits 114 (shown in FIG. 1). In alternative embodiments, experimental data may be used to determine appropriate values for resistors 314 and 316.

In some embodiments, driver 302 symmetrically drives driver signal 310 around CA_VREF 308. The term "symmetrical" refers to driver signal 310 having substantially (e.g., +/−10%) equal swings above and below CA_VREF 308. In some embodiments, calibration circuitry 114 (shown in FIG. 1) calibrates CA driver 302 so that driver signal 310 is symmetrically around CA_VREF 308. For example, calibration circuitry 114 may set the pull up values of CA driver 302 to be greater than the pull down values.

In some embodiments, calibration circuit 114 may include a series transistor (e.g., in series with the N and P transistors of CA driver 302) having a voltage that can be varied to adjust the calibration setting. In alternative embodiments, calibration circuit 114 may be based on a digital implementation that includes a different number of pull up legs versus pull down legs that can be selectively activated to control the behavior of driver signal 310.

Figure 4:
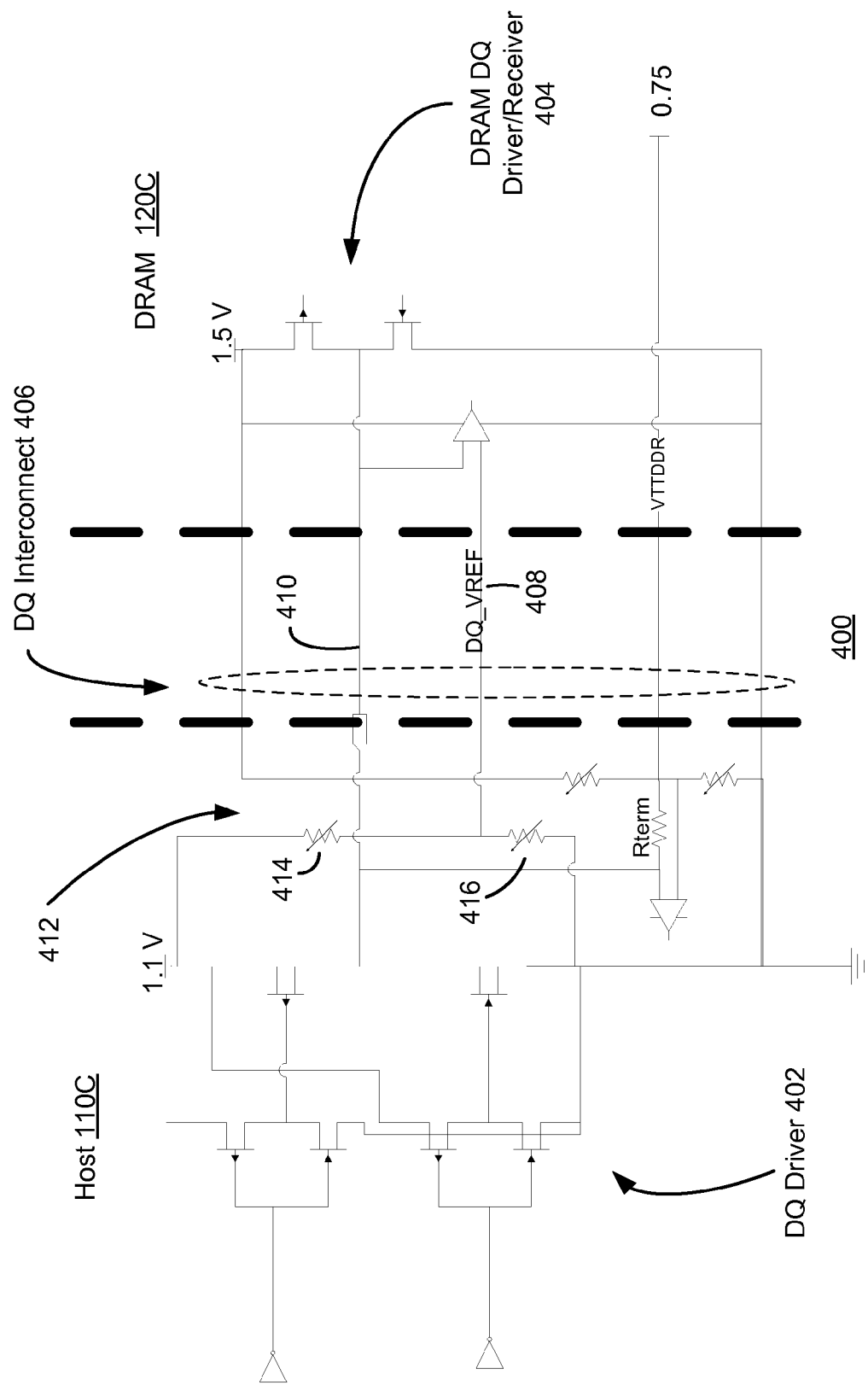
FIG. 4 is a circuit diagram illustrating selected aspects of a data I/O signal architecture, according to an embodiment of the invention.

FIG. 4 is a circuit diagram illustrating selected aspects of a data I/O signal architecture, according to an embodiment of the invention. System 400 includes DQ driver 402 and DRAM DQ driver/receiver 404 coupled together via DQ interconnect 406. For ease of description, only a single driver 402 is shown. In addition, only a portion of DQ interconnect 406 is shown. It is to be appreciated that a host (e.g., host 110) may have nearly any number of DQ drivers 402. In addition, DQ interconnect 406 may include nearly any number of bit lanes, signal lines, electrical contacts, and the like. In alternative embodiments, system 400 may include more elements, fewer elements, and/or different elements.

Unlike conventional systems, in some embodiments, the operating voltage for driver 402 is less than the operating voltage for driver/receiver 404. For example, in the illustrated embodiment, the operating voltage for driver 402 is 1.1 V and the operating voltage for driver/receiver 404 is 1.5 V. In some embodiments, system 400 includes a mechanism to adapt the interface for DQ interconnect 406 to support the lower operating voltage used by driver 402.

In particular, host 110C provides a controllable DQ_VREF 408. DQ_VREF 408 may be set to a percentage of the operating voltage for DQ driver 402 (e.g., a percentage of 1.1 V). In some embodiments, DQ_VREF 408 is set to a value that is close to the normal operating point for DRAM 120C and yet still provides adequate voltage margins for driver signal 410. For example, DQ_VREF 408 may be set to a value that is more than one half of the operating voltage of driver 402 and less than one half of the operating voltage of driver/receiver 404. In the illustrated embodiment, for example, DQ_VREF 408 may be set to (approximately) 600 mV.

Host 110C includes VREF generation circuitry 412 to generate DQ_VREF 408. In the illustrated embodiment, VREF generation circuitry 412 includes a voltage divider network (e.g., variable resistors 414 and 416). In alternative embodiments, VREF generation circuitry 412 may be implemented differently.

In some embodiments, the values of variable resistors 414 and 416 may be set during a calibration process by, for example, calibration circuits 114 (shown in FIG. 1). In alternative embodiments, experimental data may be used to determine appropriate values for resistors 414 and 416.

In some embodiments, driver 402 symmetrically drives driver signal 410 around DQ_VREF 408. The term "symmetrical" refers to driver signal 410 having substantially (e.g., +/−10%) equal swings above and below DQ_VREF 408. In some embodiments, calibration circuitry 114 (shown in FIG. 1) calibrates DQ driver 402 so that driver signal 410 is symmetrically around DQ_VREF 408. For example, calibration circuitry 114 may set the pull up values of DQ driver 402 to be greater than the pull down values.

In some embodiments, calibration circuit 114 may include a series transistor (e.g., in series with the N and P transistors of DQ driver 402) having a voltage that can be varied to adjust the calibration setting. In alternative embodiments, calibration circuit 114 may be based on a digital implementation that includes a different number of pull up legs versus pull down legs that can be selectively activated to control the behavior of driver signal 410.

FIGS. 3 and 4 illustrate an embodiment in which a host includes separate electrical contacts to provide a CA_VREF and a DQ_VREF to a DRAM. In some alternative embodiments, the host may have a single additional electrical contact to provide a single VREF to the DRAM. In such embodiments, the CA receivers and the DQ receivers in the DRAM may use the same VREF.

Figure 5:
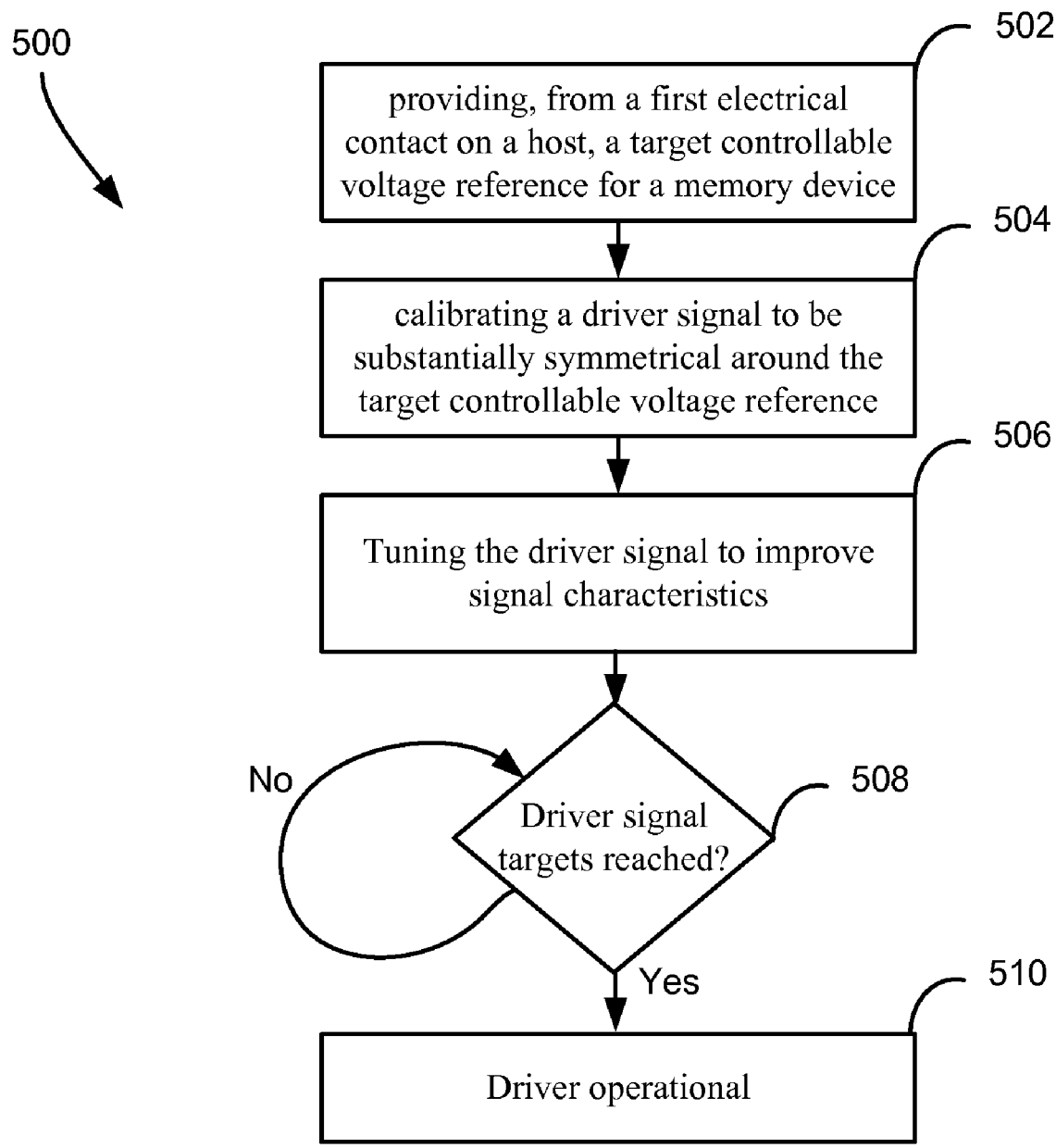
FIG. 5 is a flow diagram illustrating selected aspects of a method for calibrating a reduced signal level memory interface, according to an embodiment of the invention.

FIG. 5 is a flow diagram illustrating selected aspects of a method for calibrating a reduced signal level memory interface, according to an embodiment of the invention. Referring to process block 502, a host (e.g., host 110) provides a target controllable VREF to a memory device (e.g., memory device 120). The target controllable VREF may be a VREF that is somewhat more than one half of the operating voltage of the driver and somewhat less than one half of the operating voltage of the receiver.

Referring to process block 504, calibration circuitry (e.g., calibration circuitry 114, shown in FIG. 1) calibrates a driver signal to be substantially symmetrical around the target VREF. In some embodiments, the driver may be calibrated by, for example, adjusting the voltage to a transistor that is in series with the N and P transistors of the driver. In some alternative embodiments, the driver may be calibrated by selectively activating a different number of pull up legs versus pull down legs in the driver. In yet other alternative embodiments, a different mechanism may be used to calibrate the driver signal.

Referring to process block 506, the driver signal is tuned to improve its signal characteristics. Tuning the driver signal may include sending a test pattern to the memory device and receiving the test pattern back from the memory device to determine whether errors occur in the test pattern. If errors do occur, then the driver signal is adjusted to improve the likelihood of data capture. The process may be repeated until targets for signal quality are achieved as shown by 508.

Referring to process block 510, the driver may be operation after the driver signal is tuned. In some embodiments, process 500 is performed periodically to correct for voltage and temperature variations. In some alternative embodiments, process 500 may be performed in response to certain events such as system initialization.

Figure 6:
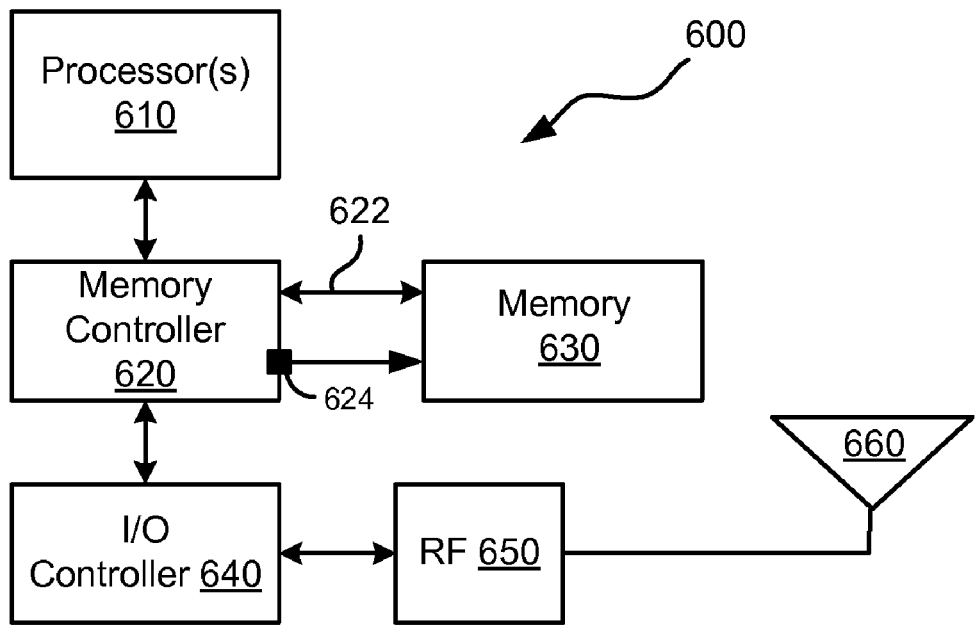
FIG. 6 is a block diagram illustrating selected aspects of an electronic system according to an embodiment of the invention.

FIG. 6 is a block diagram illustrating selected aspects of an electronic system according to an embodiment of the invention. Electronic system 600 includes processor 610, memory controller 620, memory 630, input/output (I/O) controller 640, radio frequency (RF) circuits 650, and antenna 660. In operation, system 600 sends and receives signals using antenna 660, and these signals are processed by the various elements shown in FIG. 6. Antenna 660 may be a directional antenna or an omni-directional antenna. As used herein, the term omni-directional antenna refers to any antenna having a substantially uniform pattern in at least one plane. For example, in some embodiments, antenna 660 may be an omni-directional antenna such as a dipole antenna or a quarter wave antenna. Also, for example, in some embodiments, antenna 660 may be a directional antenna such as a parabolic dish antenna, a patch antenna, or a Yagi antenna. In some embodiments, antenna 660 may include multiple physical antennas.

Radio frequency circuit 650 communicates with antenna 660 and I/O controller 640. In some embodiments, RF circuit 650 includes a physical interface (PHY) corresponding to a communication protocol. For example, RF circuit 650 may include modulators, demodulators, mixers, frequency synthesizers, low noise amplifiers, power amplifiers, and the like. In some embodiments, RF circuit 650 may include a heterodyne receiver, and in other embodiments, RF circuit 650 may include a direct conversion receiver. For example, in embodiments with multiple antennas 660, each antenna may be coupled to a corresponding receiver. In operation, RF circuit 650 receives communications signals from antenna 660 and provides analog or digital signals to I/O controller 640. Further, I/O controller 640 may provide signals to RF circuit 650, which operates on the signals and then transmits them to antenna 660.

Processor(s) 610 may be any type of processing device. For example, processor 610 may be a microprocessor, a microcontroller, or the like. Further, processor 610 may include any number of processing cores or may include any number of separate processors.

Memory controller 620 provides a communication path between processor 610 and other elements shown in FIG. 6. In some embodiments, memory controller 620 is part of a hub device that provides other functions as well. As shown in FIG. 6, memory controller 620 is coupled to processor(s) 610, I/O controller 640, and memory 630. In some embodiments, memory controller 620 (and/or memory controller 720, shown in FIG. 7) includes an additional electrical contact 624 (and/or 724) to provide a controllable VREF to memory 630. Memory controller 620 (and/or memory controller 720) may provide one or more driver signals to memory 630 that are symmetrical around VREF.

Memory 630 may include multiple memory devices. These memory devices may be based on any type of memory technology. For example, memory 630 may be random access memory (RAM), dynamic random access memory (DRAM), static random access memory (SRAM), nonvolatile memory such as FLASH memory, or any other type of memory.

Memory 630 may represent a single memory device or a number of memory devices on one or more modules. Memory controller 620 provides data through interconnect 622 to memory 630 and receives data from memory 630 in response to read requests. Commands and/or addresses may be provided to memory 630 through interconnect 622 or through a different interconnect (not shown). Memory controller 620 may receive data to be stored in memory 630 from processor 610 or from another source. Memory controller 620 may provide the data it receives from memory 630 to processor 610 or to another destination. Interconnect 622 may be a bi-directional interconnect or a unidirectional interconnect. Interconnect 622 may include a number of parallel conductors. The signals may be differential or single ended. In some embodiments, interconnect 622 operates using a forwarded, multiphase clock scheme.

Memory controller 620 is also coupled to I/O controller 640 and provides a communications path between processor (s) 610 and I/O controller 640. I/O controller 640 includes circuitry for communicating with I/O circuits such as serial ports, parallel ports, universal serial bus (USB) ports and the like. As shown in FIG. 6, I/O controller 640 provides a communication path to RF circuits 650.

Figure 7:
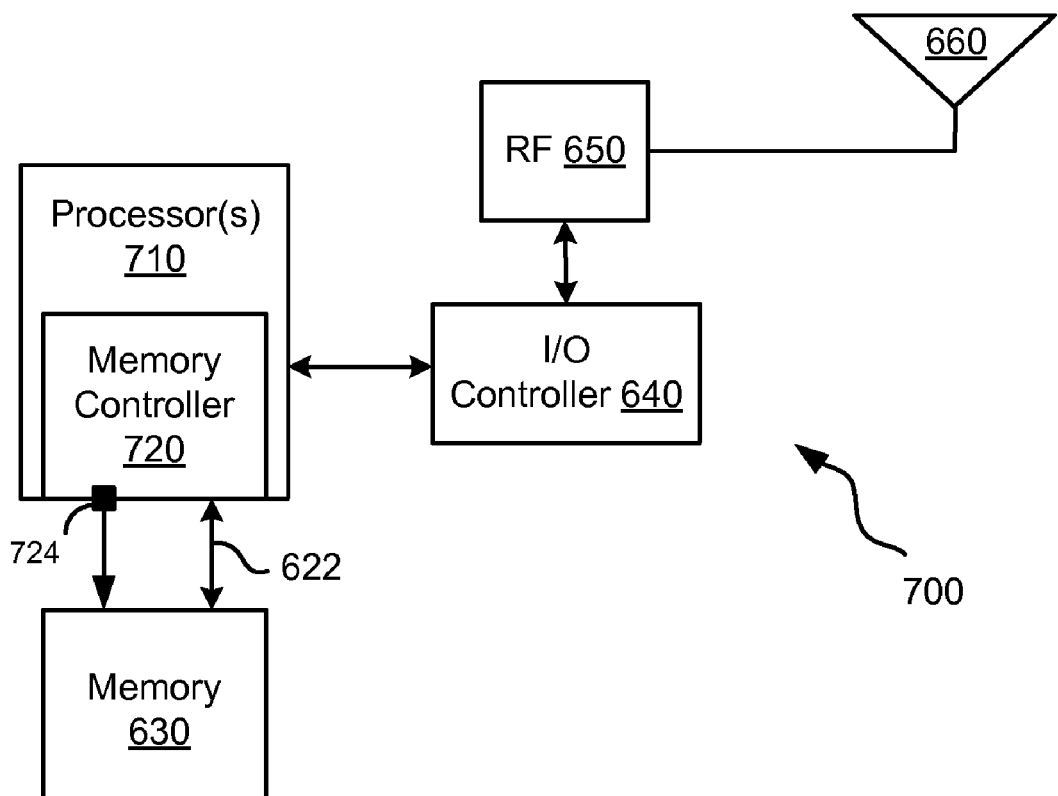
FIG. 7 is a bock diagram illustrating selected aspects of an electronic system according to an alternative embodiment of the invention.

FIG. 7 is a bock diagram illustrating selected aspects of an electronic system according to an alternative embodiment of the invention. Electronic system 700 includes memory 730, I/O controller 740, RF circuits 750, and antenna 760, all of which are described above with reference to FIG. 7. Electronic system 700 also includes processor(s) 710 and memory controller 720. As shown in FIG. 7, memory controller 720 may be on the same die as processor(s) 710. Processor(s) 710 may be any type of processor as described above with reference to processor 710 (FIG. 5). Example systems represented by FIGS. 6 and 7 include desktop computers, laptop computers, servers, cellular phones, personal digital assistants, digital home systems, and the like.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An integrated circuit comprising:
 a first electrical contact to provide a driver signal to a memory device;
 driver circuitry coupled with the first electrical contact to generate the driver signal for the memory device, wherein a driver operating voltage differs from a memory device operating voltage;
 a second electrical contact to provide a controllable voltage reference to the memory device, the memory device to use the controllable voltage reference as a reference for the driver signal; and
 voltage reference generation circuitry coupled with the second electrical contact to generate the controllable voltage reference, wherein the controllable voltage reference is based, at least in part, on the driver operating voltage.

2. The integrated circuit of claim 1, wherein the driver operating voltage is less than the memory device operating voltage.

3. The integrated circuit of claim 1, wherein the driver signal is to be driven symmetrically about the controllable voltage reference.

4. The integrated circuit of claim 1, wherein the driver signal is a command/address signal and the controllable voltage reference provides a voltage reference for the command/address signal.

5. The integrated circuit of claim 1, wherein the driver signal is a data signal and the controllable voltage reference provides a voltage reference for the data signal.

6. The integrated circuit of claim 1, further comprising:
 a third electrical contact to provide a second driver signal to the memory device;
 second driver circuitry coupled with the third electrical contact to generate the second driver signal for the memory device, wherein a second driver operating voltage differs from the memory device operating voltage;
 a fourth electrical contact to provide a second controllable voltage reference to the memory device, the memory device to use the second controllable voltage reference as a reference for the second driver signal; and second voltage reference generation circuitry coupled with the fourth electrical contact to generate the second controllable voltage reference, wherein the second controllable voltage reference is based, at least in part, on the second driver operating voltage.

7. The integrated circuit of claim 6,
wherein the driver signal is a command/address signal and the controllable voltage reference provides a voltage reference for the command/address signal; and further
wherein the second driver signal is a data signal and the second controllable voltage reference provides a voltage reference for the data signal.

8. The integrated circuit of claim 7,
wherein the driver operating voltage for the driver circuitry and the second driver circuitry is less than the memory device operating voltage.

9. The integrated circuit of claim 8,
wherein the command/address signal is to be driven symmetrically about the controllable voltage reference; and further
wherein the data signal is to be driven symmetrically about the second controllable voltage reference.

10. The integrated circuit of claim 1, wherein the voltage reference generation circuitry comprises a voltage divider circuit to set the controllable voltage reference to a percentage of the driver operating voltage.

11. A method comprising:
providing, from a first electrical contact on a host, a target controllable voltage reference for a memory device, wherein the target controllable voltage reference is based, at least in part, on a driver operating voltage, wherein the driver operating voltage differs from a memory device operating voltage; and
calibrating a driver signal to be driven symmetrically around the target controllable voltage reference, the memory device to use the controllable voltage reference as a reference for the driver signal.

12. The method of claim 11, further comprising:
sending, via the driver signal, a test pattern to the memory device;
receiving a received test pattern from the memory device responsive to sending the test pattern to the memory device; and
adjusting the driver signal based, at least in part, on the received test pattern.

13. The method of claim 11, wherein the host includes a memory controller and the memory device includes a dynamic random access memory device (DRAM).

14. A system comprising:
a memory device; and
a host coupled with the memory device via a memory interconnect, the host including a first electrical contact to provide a driver signal to the memory device;
driver circuitry coupled with the first electrical contact to generate the driver signal for the memory device, wherein a driver operating voltage differs from a memory device operating voltage;
a second electrical contact to provide a controllable voltage reference to the memory device, the memory device to use the controllable voltage reference as a reference for the driver signal; and
voltage reference generation circuitry coupled with the second electrical contact to generate the controllable voltage reference, wherein the controllable voltage reference is based, at least in part, on the driver operating voltage.

15. The system of claim 14, wherein the driver operating voltage is less than the memory device operating voltage.

16. The system of claim 14, wherein the driver signal is to be driven symmetrically about the controllable voltage reference.

17. The system of claim 14, wherein the driver signal is a command/address signal and the controllable voltage reference provides a voltage reference for the command/address signal.

18. The system of claim 14, wherein the driver signal is a data signal and the controllable voltage reference provides a voltage reference for the data signal.

19. The system of claim 14, wherein the host further includes
a third electrical contact to provide a second driver signal to the memory device;
second driver circuitry coupled with the third electrical contact to generate the second driver signal for the memory device, wherein a second driver operating voltage differs from the memory device operating voltage;
a fourth electrical contact to provide a second controllable voltage reference to the memory device, the memory device to use the second controllable voltage reference as a reference for the second driver signal; and
second voltage reference generation circuitry coupled with the fourth electrical contact to generate the second controllable voltage reference, wherein the second controllable voltage reference is based, at least in part, on the second driver operating voltage.

20. The system of claim 19,
wherein the driver signal is a command/address signal and the controllable voltage reference provides a voltage reference for the command/address signal; and further
wherein the second driver signal is a data signal and the second controllable voltage reference provides a voltage reference for the data signal.

21. The system of claim 20,
wherein the driver operating voltage for the driver circuitry and the second driver circuitry is less than the memory device operating voltage.

22. The system of claim 21,
wherein the command/address signal is to be driven symmetrically about the controllable voltage reference; and further
wherein the data signal is to be driven symmetrically about the second controllable voltage reference.

23. The system of claim 14, wherein the voltage reference generation circuitry comprises a voltage divider circuit to set the controllable voltage reference to a percentage of the driver operating voltage.

* * * * *